United States Patent
Baronian et al.

(10) Patent No.: US 12,267,980 B2
(45) Date of Patent: Apr. 1, 2025

(54) POWER CONVERTER SYSTEM

(71) Applicant: EATON INTELLIGENT POWER LIMITED, Dublin (IE)

(72) Inventors: Armen Baronian, Toronto (CA); Yash Veer Singh, Menomonee Falls, WI (US); Piranavan Suntharalingam, Menomonee Falls, WI (US); Mikhail Goykhman, Reseda, CA (US); Galen Chui, Ladera Ranch, CA (US)

(73) Assignee: Eaton Intelligent Power Limited, Dublin (IE)

( * ) Notice: Subject to any disclaimer, the term of this patent is extended or adjusted under 35 U.S.C. 154(b) by 264 days.

(21) Appl. No.: 17/787,194

(22) PCT Filed: Dec. 15, 2020

(86) PCT No.: PCT/EP2020/025577
§ 371 (c)(1),
(2) Date: Jun. 17, 2022

(87) PCT Pub. No.: WO2021/121660
PCT Pub. Date: Jun. 24, 2021

(65) Prior Publication Data
US 2023/0050545 A1 Feb. 16, 2023

Related U.S. Application Data

(60) Provisional application No. 62/949,868, filed on Dec. 18, 2019.

(51) Int. Cl.
*H05K 7/20* (2006.01)
*H05K 7/14* (2006.01)

(52) U.S. Cl.
CPC ........... *H05K 7/1457* (2013.01); *H05K 7/209* (2013.01)

(58) Field of Classification Search
CPC .................................................... H05K 7/1457
See application file for complete search history.

(56) References Cited

U.S. PATENT DOCUMENTS

| | | | |
|---|---|---|---|
| 5,305,185 A * | 4/1994 | Samarov | H01L 23/4006 174/16.3 |
| 5,387,859 A * | 2/1995 | Murugan | H02M 5/4585 290/46 |

(Continued)

OTHER PUBLICATIONS

Single switch with Series diode Trench + Field Stop IGBT4, Microsemi Power Products Group, APTGL475U120DAG Rev 2, Oct. 2012, 6 pages (Year: 2012).*

(Continued)

*Primary Examiner* — Robert J Hoffberg
(74) *Attorney, Agent, or Firm* — Merchant & Gould P.C.

(57) ABSTRACT

A power converter system includes a printed circuit board having a first connector for receiving low voltage control signals and a second connector for receiving input voltages from one or more power generators and transmitting output voltages to a power distribution unit. Power devices are mounted onto the printed circuit board to manage the input voltages and to generate the output voltages. An enclosure is mounted around the printed circuit board and power devices. The power devices engage interior surfaces of the enclosure forming a conductive heat path between the power devices, the interior surfaces, and exterior surfaces of the enclosure. The heat path conductively transfers heat from the power devices to the exterior surfaces.

12 Claims, 12 Drawing Sheets

(56) References Cited

U.S. PATENT DOCUMENTS

| | | | | |
|---|---|---|---|---|
| 6,038,129 | A * | 3/2000 | Falaki | H05K 7/209 361/689 |
| 8,946,567 | B2 * | 2/2015 | Nakatsu | H02M 7/003 174/547 |
| 8,966,747 | B2 * | 3/2015 | Vinciarelli | H05K 1/0298 29/830 |
| 8,975,740 | B2 * | 3/2015 | Horie | H01L 23/49811 257/693 |
| 9,402,319 | B2 * | 7/2016 | Vinciarelli | H05K 5/065 |
| 9,439,297 | B2 * | 9/2016 | Vinciarelli | B29C 45/0055 |
| 9,516,761 | B2 * | 12/2016 | Vinciarelli | H01R 27/02 |
| 9,936,580 | B1 * | 4/2018 | Vinciarelli | B23K 1/0016 |
| 10,701,828 | B1 * | 6/2020 | Vinciarelli | H05K 5/065 |
| 10,757,816 | B2 * | 8/2020 | Vinciarelli | H05K 5/065 |
| 10,777,473 | B2 * | 9/2020 | Kodaira | H01L 23/053 |
| 10,791,645 | B1 * | 9/2020 | Vinciarelli | H05K 3/0044 |
| 11,006,523 | B1 * | 5/2021 | Vinciarelli | B23K 1/20 |
| 11,266,020 | B1 * | 3/2022 | Vinciarelli | B23K 1/0016 |
| 11,751,338 | B1 * | 9/2023 | Vinciarelli | H05K 3/284 361/752 |
| 2012/0287582 | A1 | 11/2012 | Vinciarelli et al. | |
| 2019/0342429 | A1 | 11/2019 | Sheffield et al. | |

OTHER PUBLICATIONS

Digi-Key Electronics, 126-4 Wakefield-Vette, Fans, Thermal Management, first accessed on Dec. 6, 2019, https://www.digikey.com/en/products/detail/wakefield-vette/126-4/340309, 4 pages.

Digi-Key Electronics, A16367-0 Laird Technologies—Thermal Materials, Fans, Thermal Management, first accessed on Dec. 6, 2019, https://www.digikey.com/en/products/detail/laird-technologies-thermal-materials/A16367-02/02633616, 5 pages.

International Search Report and Written Opinion of the International Searching Authority for International Patent Application No. PCT/EP2020/025577 mailed May 21, 2021, 17 pages.

\* cited by examiner

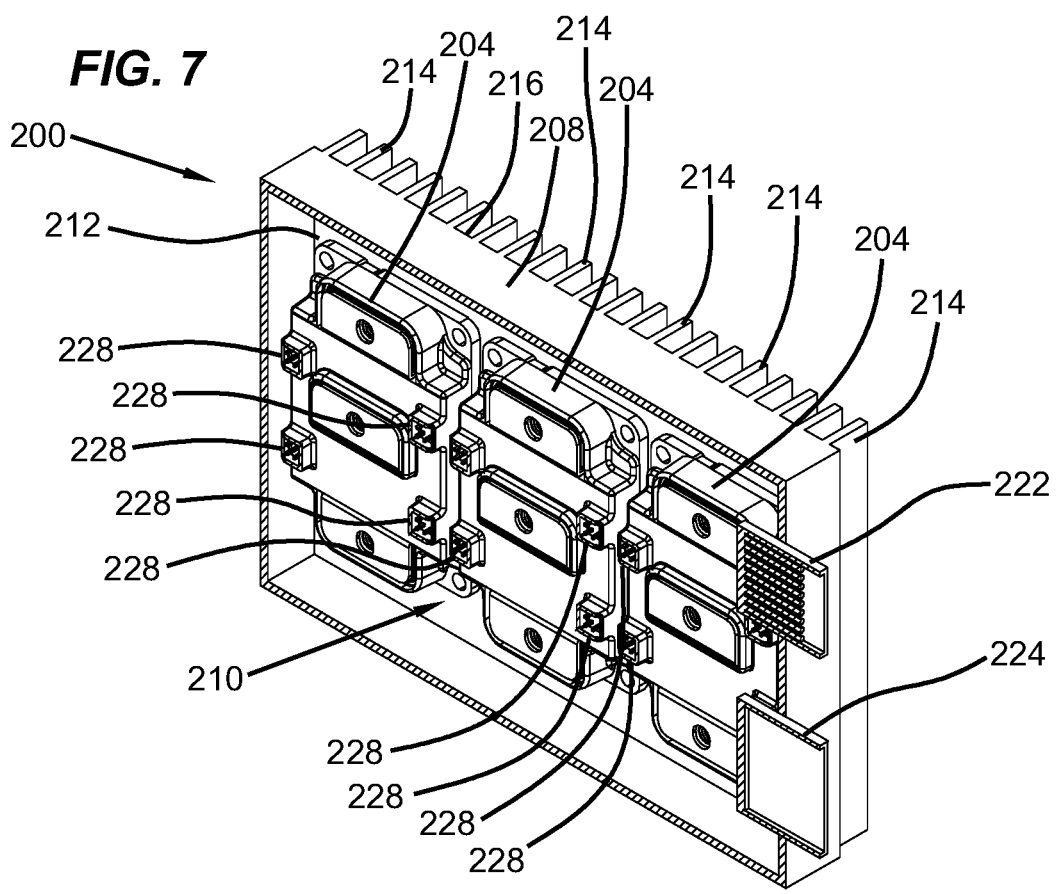
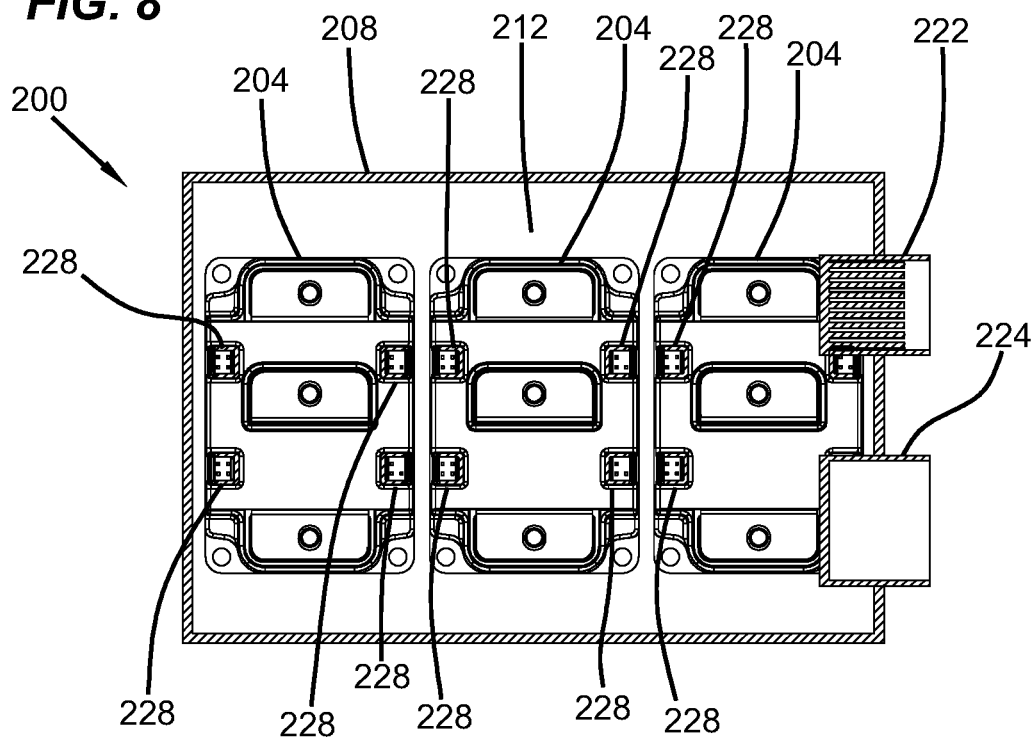

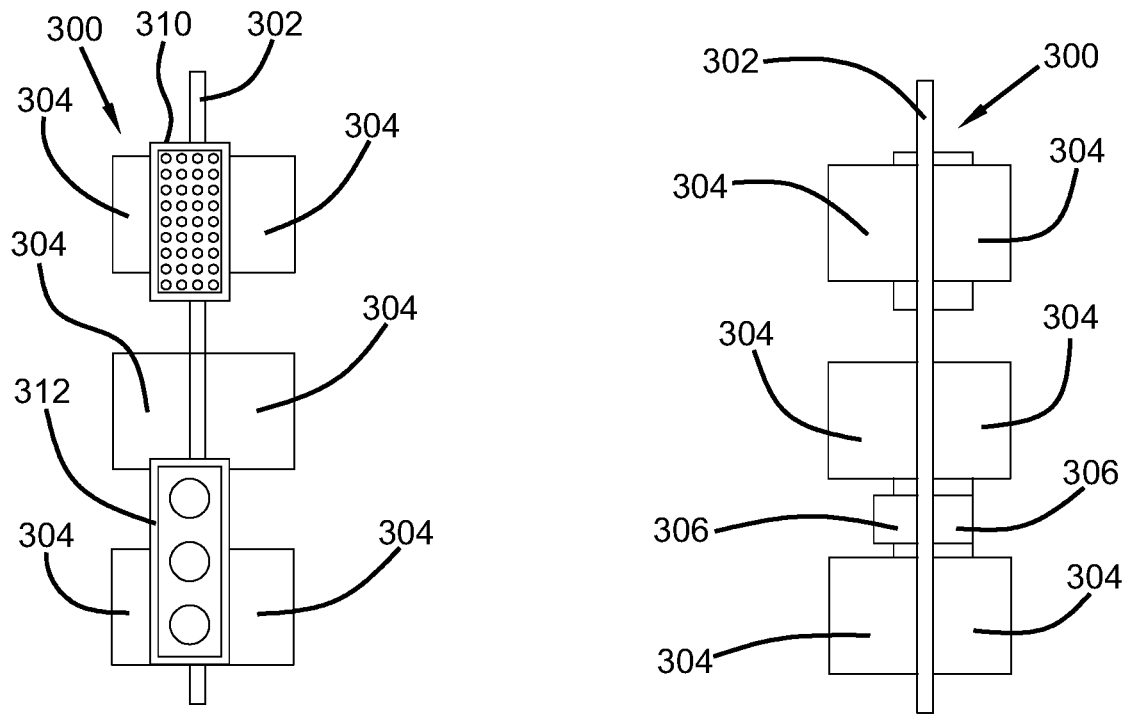
FIG. 19  FIG. 20
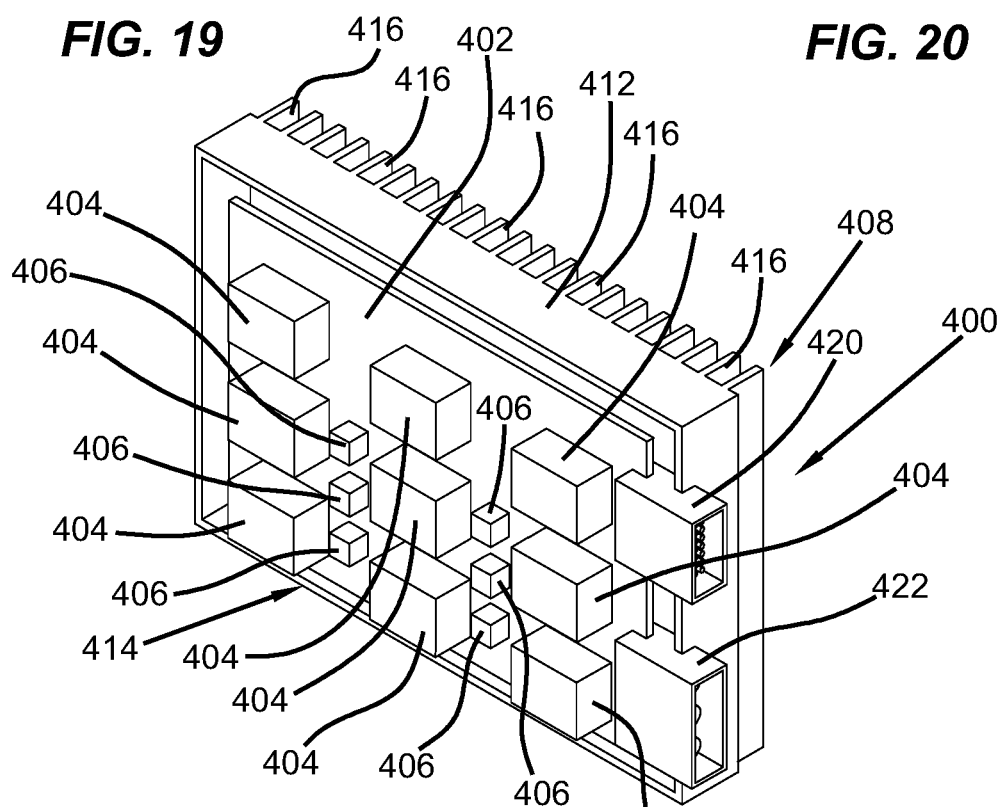
FIG. 21

POWER CONVERTER SYSTEM

CROSS-REFERENCE TO RELATED APPLICATION

This application is a National Stage Application of PCT/EP2020/025577, filed on Dec. 15, 2020, which claims the benefit of U.S. Patent Application Ser. No. 62/949,868, filed on Dec. 18, 2019, the disclosures of which are incorporated herein by reference in their entireties. To the extent appropriate, a claim of priority is made to each of the above disclosed applications.

BACKGROUND

More-electric aircraft and all-electric aircraft are increasingly becoming more prevalent in the aerospace industry. These types of aircraft require electrical systems that can generate higher voltages than traditional electrical systems.

The various electrical loads on aircraft consume electrical power at different voltages, and thus have different power requirements. Therefore, the aircraft electrical systems rely on electrical power converters for efficient and effective electrical power management.

SUMMARY

In general terms, the present disclosure relates to a power converter system. In one possible configuration and by non-limiting example, the power converter system combines multiple functions into a single component to eliminate certain dedicated components from the system, and thereby reduce the weight of the system. Various aspects are described in this disclosure, which include, but are not limited to, the following aspects.

In one aspect, a power converter system has a printed circuit board with a first connector for receiving low voltage control signals and a second connector for receiving input voltages from one or more power generators and transmitting output voltages to a power distribution unit. Power devices are mounted onto the printed circuit board and are configured to manage the input voltages and generate the output voltages. An enclosure is mounted around the printed circuit board and power devices. The enclosure has interior surfaces and exterior surfaces. The power devices engage the interior surfaces of the enclosure forming a conductive heat path between the power devices, the interior surfaces, and the exterior surfaces that conductively transfers heat from the power devices to the exterior surfaces. The conductive heat path between the power devices and the enclosure has a combined cross-sectional area taken transverse to the direction of heat flow that is at least half the total surface area of the interior surfaces.

In another aspect, a power converter system comprises a power distribution unit configured to distribute electrical power; a power conversion assembly configured to be integrated into the power distribution unit, the power conversion assembly including: a printed circuit board having a first connector for receiving low voltage control signals and a second connector for receiving input voltages from the one or more power generators and transmitting output voltages to the power distribution unit; power devices mounted onto the printed circuit board, the power devices being configured to manage the input voltages and generate the output voltages; and control devices mounted onto the printed circuit board, the control devices being configured to receive the low voltage control signals to control the power devices; wherein the power conversion assembly transfers heat to the power distribution unit by thermal transmission paths defined directly between the power devices and the power distribution unit when the power conversion assembly is integrated in the power distribution unit.

A variety of additional inventive aspects will be set forth in the description that follows. The inventive aspects can relate to individual features and to combinations of features. It is to be understood that both the forgoing general description and the following detailed description are exemplary and explanatory only and are not restrictive of the broad inventive concepts upon which the examples disclosed herein are based.

DESCRIPTION OF THE FIGURES

The following drawing figures, which form a part of this application, are illustrative of described technology and are not meant to limit the scope of the disclosure in any manner.

FIG. 7 is a cross-sectional isometric view of the power converter system of FIG. 2 taken along a second plane defined by the length and height of the enclosure.

FIG. 8 is a cross-sectional side view of the power converter system of FIG. 2.

FIG. 19 is a front view of the power converter system of FIG. 16.

FIG. 20 is a rear view of the power converter system of FIG. 16.

FIG. 21 is an isometric view of a power converter system in accordance with another embodiment of the present application, the power converter system is shown with an enclosure partially removed therefrom.

DETAILED DESCRIPTION

Figure 1:
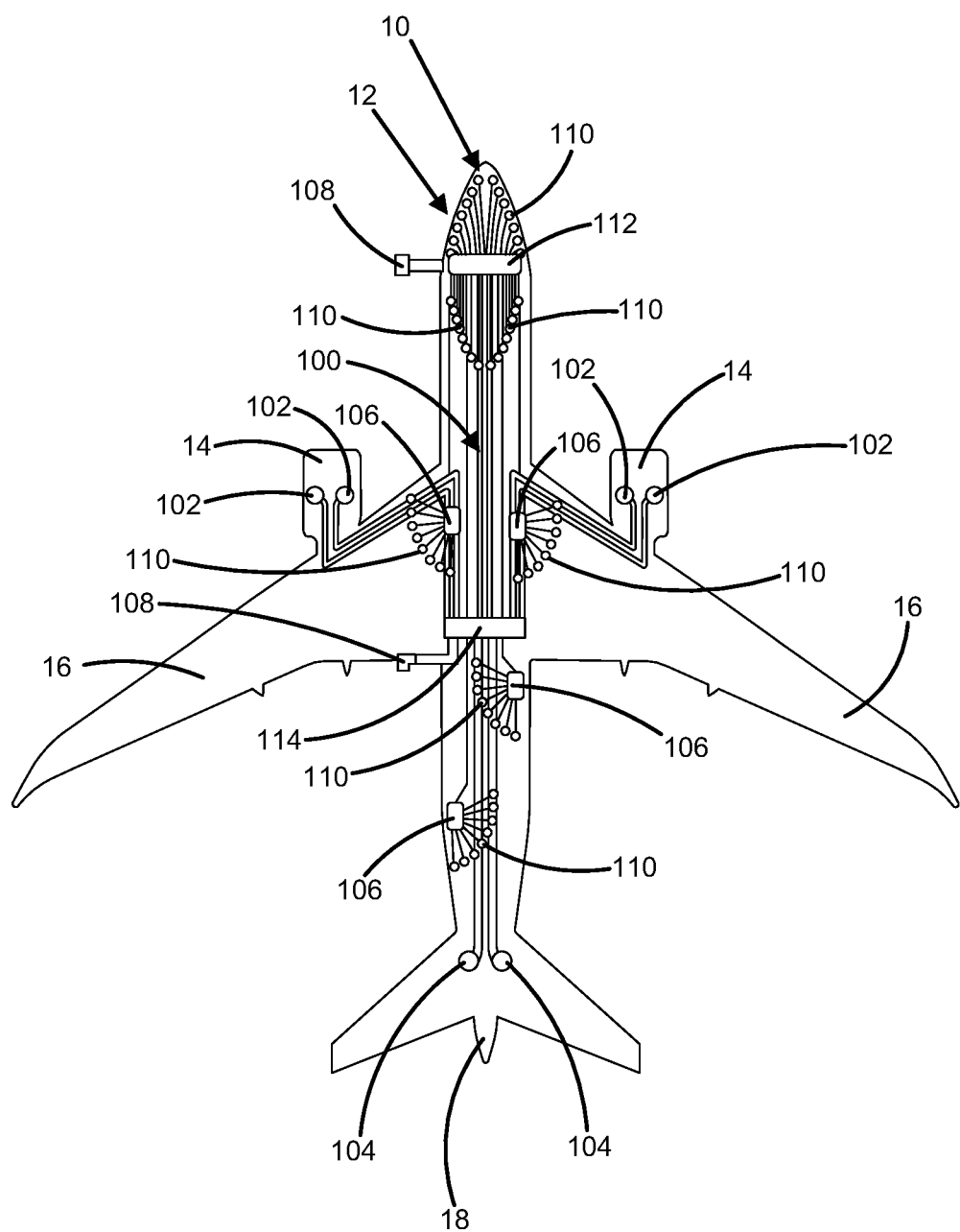
FIG. 1 schematically illustrates an electrical system for an aircraft.

Various embodiments will be described in detail with reference to the drawings, wherein like reference numerals represent like parts and assemblies throughout the several views. Reference to various embodiments does not limit the scope of the claims attached hereto. Additionally, any examples set forth in this specification are not intended to be limiting and merely set forth some of the many possible embodiments for the appended claims.

FIG. 1 schematically illustrates an electrical system 100 for an aircraft 10. In some examples, the aircraft 10 includes a more-electric system 12 such that the aircraft 10 uses more electricity, instead of pneumatics, to power the various systems on the aircraft 10 such as hydraulics, wing ice protection, and the like. Benefits of the more-electric system 12 include more efficient power generation, distribution, and use leading to reduced wiring and weight, better fuel efficiency, fewer maintenance tasks, lower maintenance costs, and less drag and noise. Since the more-electric system 12 uses more electricity, the electrical system 100 generates more electricity than conventional aircraft electrical systems.

The electrical system 100 generates, controls, and distributes power to electrical loads 110 on the aircraft 10 that require electrical power such as flight deck displays, flight controls, in-flight entertainment, and the like. The various components of the electrical system 100 are serviced by a forward electrical equipment bay 112 or an aft electrical equipment bay 114.

The electrical system 100 includes power generators 102 on each main engine 14 of the aircraft 10. The main engines 14 are located on the wings 16 of the aircraft 10. In the illustrated example, the electrical system 100 includes two power generators 102 on each main engine 14. Alternative configurations may include a varying number of power generators 102 such that the electrical system 100 may have fewer or more than two power generators per main engine 14, and may have fewer than or more than four power generators 102 total.

The electrical system 100 includes auxiliary power units 104 located toward the tail 18 of the aircraft 10. The auxiliary power units 104 are small turbine engines. In the illustrated example, the electrical system 100 includes two auxiliary power units 104. Alternative configurations may include a varying number of auxiliary power units 104 such that the electrical system 100 may have fewer or more than two auxiliary power units 104.

In the illustrative example of FIG. 1, the electrical system 100 includes six power generators total (i.e., four power generators 102 and two auxiliary power units 104). As described above, alternative configurations for the electrical system 100 may include a varying number of power generators 102 and auxiliary power units 104, respectively, such that the electrical system 100 may have fewer or more than six power generators total.

While on the ground, the aircraft 10 can be started without any ground power by using an auxiliary power unit battery to start the auxiliary power units 104. Thereafter, the auxiliary power units 104 power the power generators 102 located next to each of the main engines 14 of the aircraft 10. The power generators 102 are then used to start the main engines 14.

During flight, the power generators 102 are the primary sources of electrical power for the aircraft 10 while the auxiliary power units 104 are secondary. Electrical power runs from the power generators 102 to power distribution units 106 which are alternating current (AC) buses where the electrical power is either distributed for use as is (e.g., 235 V AC) or is converted into one or more voltages that satisfy the power requirements of the various electrical loads 110.

Other power sources for the aircraft 10 include a main battery used primarily for brief ground operations and braking, the auxiliary power unit battery which, as described above, helps start the auxiliary power units 104, and ground power which can connect through external power receptacles 108. The main battery, auxiliary power unit battery, and a ram air turbine are available as backup power in flight in the unlikely event of a power failure.

The electrical system 100 includes multiple layers of redundancy for continued safe operation. For example, the electrical system 100 is designed so that the aircraft 10 can fly for more than 330 minutes on only one engine and one of the six power generators and land safely.

Figure 2:
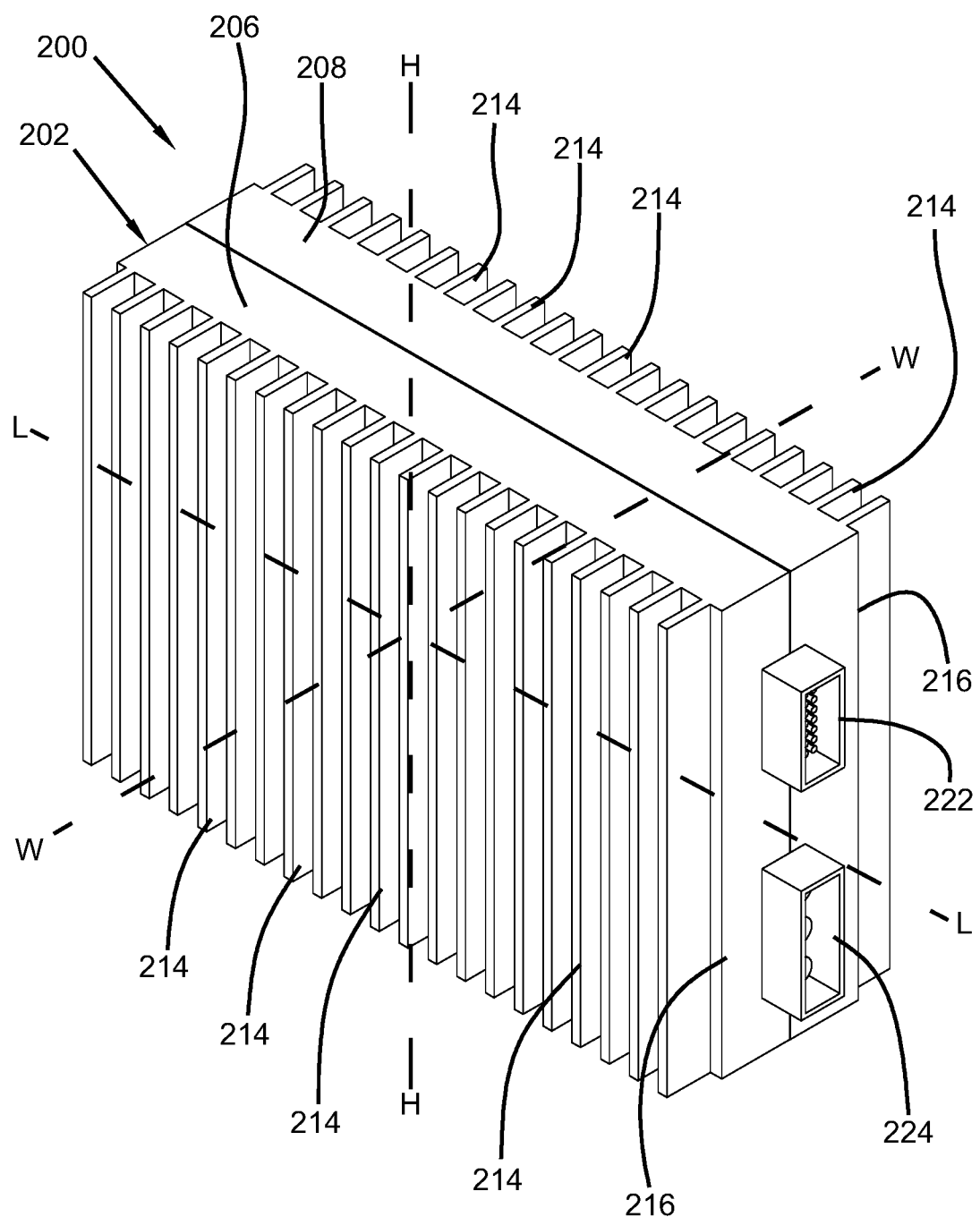
FIG. 2 is an isometric view of a power converter system in accordance with a first embodiment of the present application.

FIG. 2 is an isometric view of a power converter system 200 that transforms the electrical power generated from the power generators 102 into one or more voltages that are usable by the various electrical loads 110 on the aircraft 10. While the following description describes the power converter system 200 as being used on an aircraft such as the one shown and described above with reference to FIG. 1, the power converter system 200 can be used on a variety of different vehicles including high speed trains, buses, trucks, cars, and the like.

A plurality of power converter systems 200 can be utilized by the electrical system 100 of the aircraft 10. The power converter systems 200 can be located in the forward electrical equipment bay 112 or the aft electrical equipment bay 114 and/or adjacent to the power distribution units 106. In this example embodiment, the power converter systems 200 are standalone units that are separate from the power distribution units 106 of the aircraft.

As shown in FIG. 2, the power converter system 200 includes an enclosure 202 that protects a plurality of power devices. The enclosure 202 is made from a material that has good thermal conductivity. In some examples, the enclosure 202 is made from aluminum or aluminum alloys. In some further examples, the enclosure 202 is made from a lightweight thermally conductive composite material such as carbon fiber and other similar materials.

As shown in the example illustrated in FIG. 2, the enclosure 202 has a substantially rectangular box shape having a length along a plane defined by an axis L-L, a width along a plane defined by an axis W-W, and a height along a plane defined by an axis H-H. Alternative shapes for the enclosure 202 are possible. Also, alternative relative dimensions for the length, width, and height of the enclosure 202 are possible as well.

As will be described in more detail, the power converter system 200 utilizes the enclosure 202 as a heat exchanger to cool down the plurality of power devices. Thus, the power converter system 200 combines multiple functions (i.e., protecting the power devices from outside elements while also providing a conductive heat path) into a single component part (i.e., the enclosure 202), and advantageously eliminates the need for a dedicated heatsink which is heavy and bulky. By utilizing the enclosure 202 as a heatsink, the weight and size of the power converter system 200 are reduced. The reduction in weight and size of the power converter system 200 is especially advantageous for aircraft which are sensitive to weight.

Figure 3:
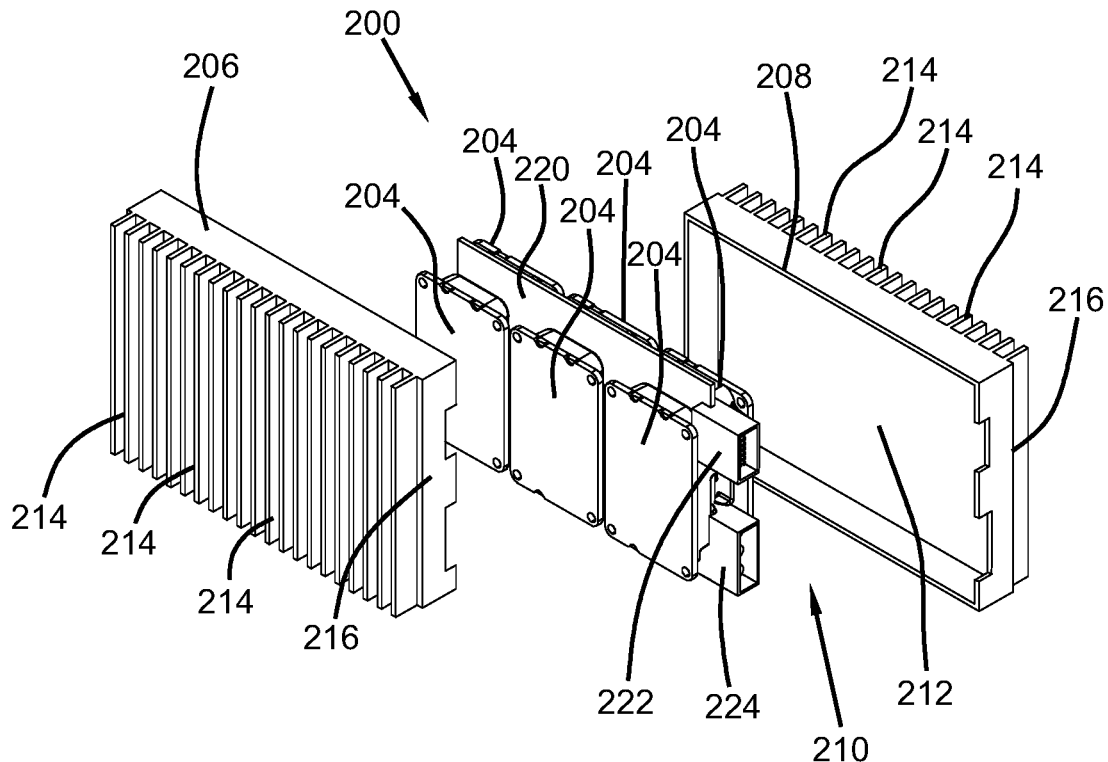
FIG. 3 is an exploded isometric view of the power converter system of FIG. 2.
Figure 4:
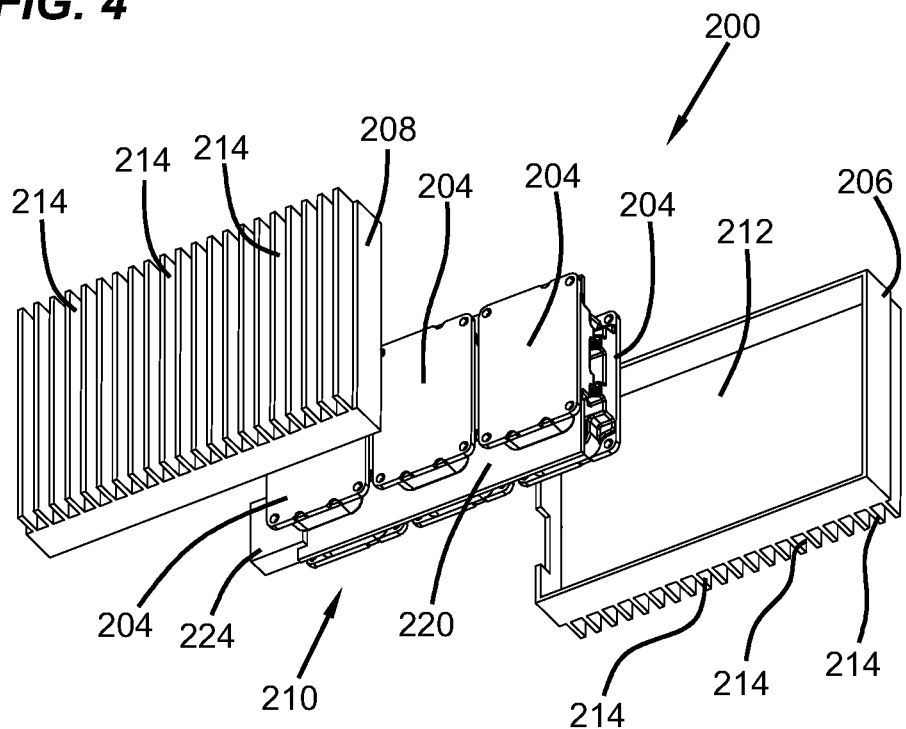
FIG. 4 is another exploded isometric view of the power converter system of FIG. 2.
Figure 5:
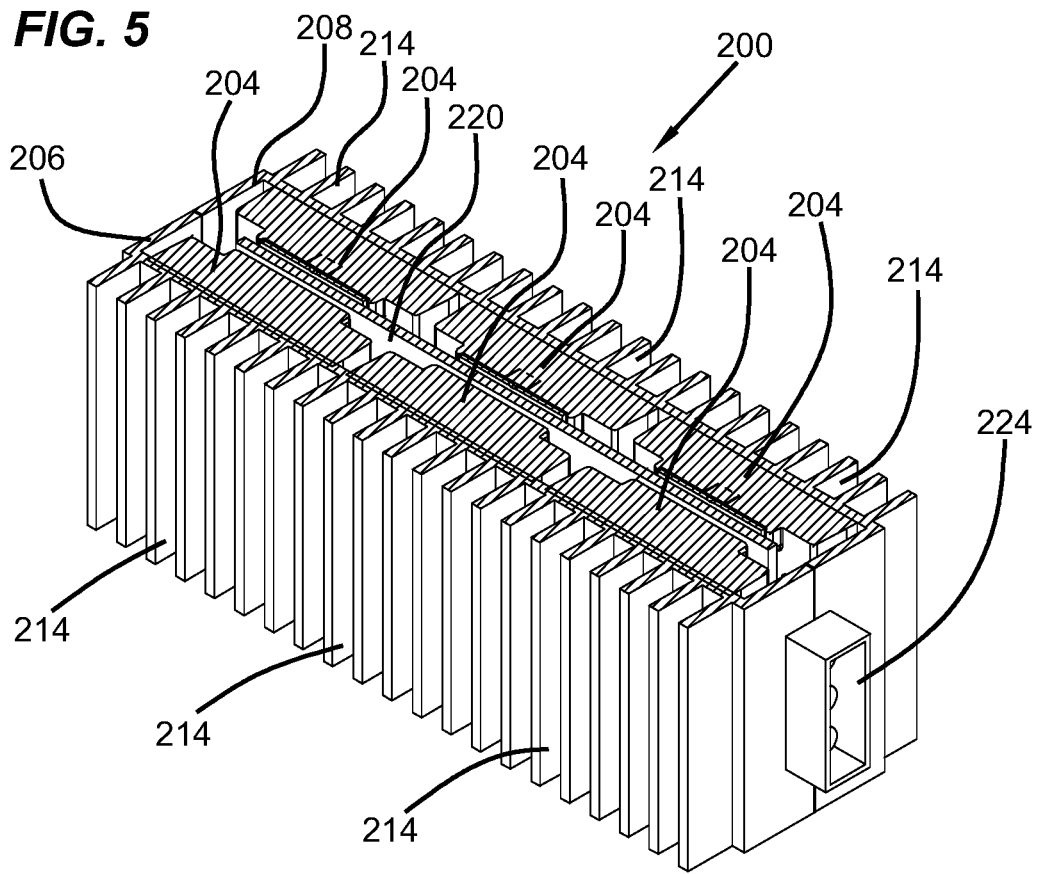
FIG. 5 is a cross-sectional isometric view of the power converter system of FIG. 2 taken along a first plane defined by the length and width of an enclosure thereof.
Figure 6:
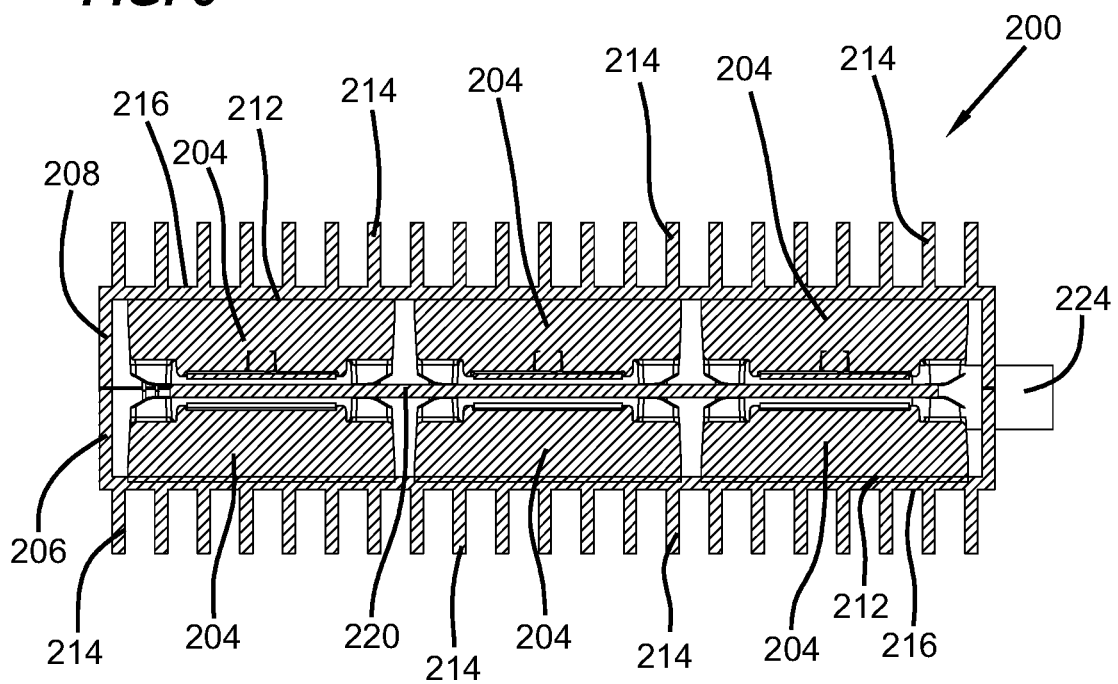
FIG. 6 is a cross-sectional top view of the power converter system of FIG. 2.
Figure 10:
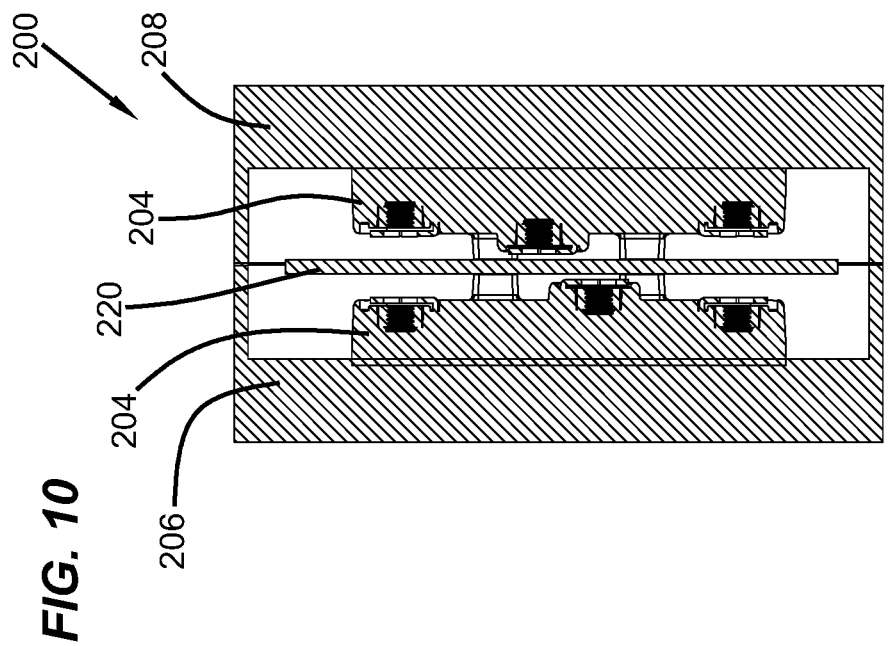
FIG. 10 is a cross-sectional front view of the power converter system of FIG. 2.
Figure 9:
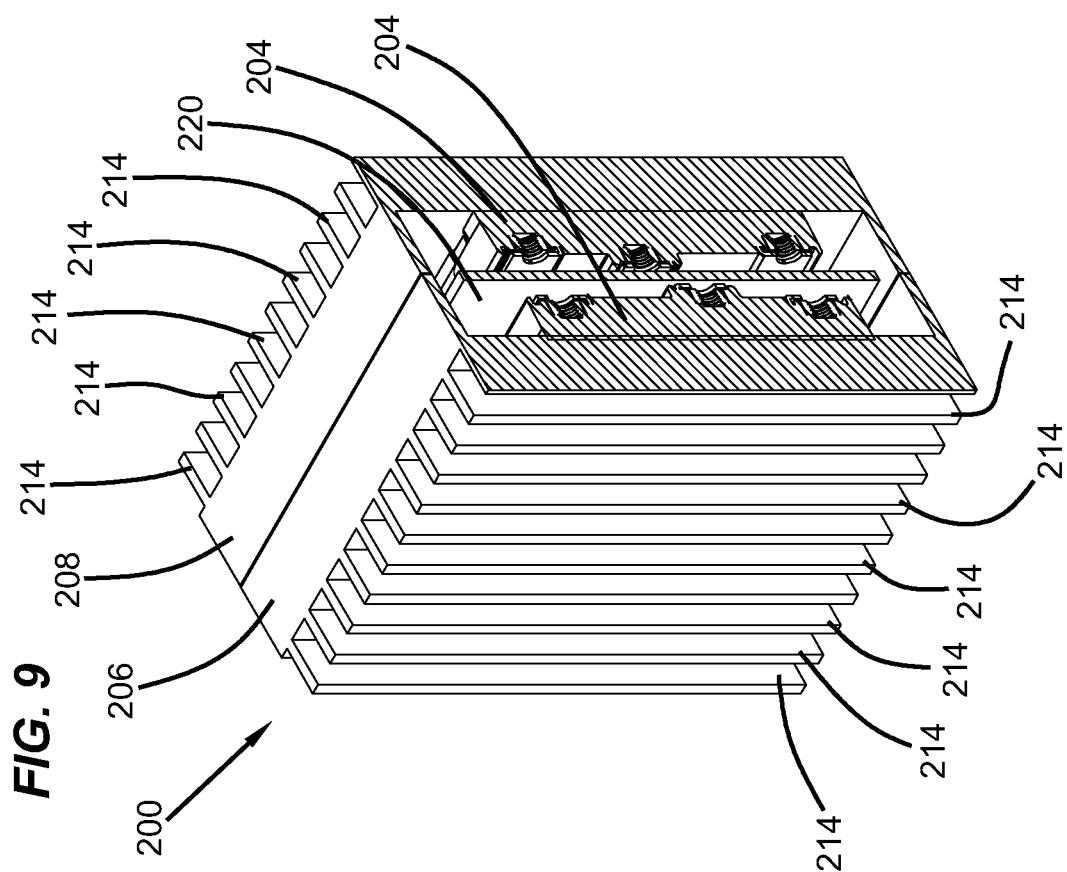
FIG. 9 is a cross-sectional isometric view of the power converter system of FIG. 2 taken along a third plane defined by the width and height of the enclosure.

FIGS. 3 and 4 are exploded isometric views of the power converter system 200. The enclosure 202 includes a plurality of power devices 204 that are used to transform the raw voltages generated by the power generators 102 into a one or more voltages that are usable by the electrical loads 110. In this example, the power devices 204 are power modules that each include a plurality of electrical switches suitable for managing electrical power loads such as solid-state switches, power controllers and inverters, DC/AC converters, and the like. As an illustrative example, the power devices 204 are power modules that include a plurality of metal-oxide-semiconductor field-effect transistors (MOSFET), insulated-gate bipolar transistors (IGBT), and similar types of devices. The power devices 204 in this example provide a higher power density (kW/kg) and current density (A/kg) for the power converter system 200.

As shown in FIGS. 3 and 4, the power devices 204 are mounted to a printed circuit board 220. The printed circuit board 220 is multilayered and has signal and power carrying traces. The printed circuit board 220 includes first and second connectors 222, 224 and control devices for controlling the operation of the power devices 204. The printed circuit board 220 will be described in more detail with reference to FIGS. 11-15.

The power devices 204 generate heat in the form of conduction and switching losses. Ideally, these heat losses should transfer to ambient with a lowest possible thermal impedance to improve the performance and efficiency of the power converter system 200. To optimally reduce the thermal impedance, the power devices 204 are mounted to the enclosure 202. In some examples, the enclosure 202 is naturally cooled through convection. In some examples, an optional fan is mounted outside and adjacent to the enclosure 202 for forced air cooling. In yet some further alternative examples, the enclosure 202 is cooled by liquid cooling.

As shown in FIGS. 3 and 4, the enclosure 202 includes first and second portions 206, 208 that each have interior surfaces 212 that partially shape an internal cavity 210 for housing the power devices 204 inside the enclosure 202. The power devices 204 mount onto the interior surfaces 212. The first and second portions 206, 208 when assembled together surround and protect the power devices 204 from outside elements. The first and second portions 206, 208 each include exterior surfaces 216 that have fins 214 that increase the surface area of the exterior surfaces 216 and enhance the cooling effectiveness of the enclosure 202.

FIG. 5-10 depict various cross-sectional views of the power converter system 200. With reference now to FIGS. 5-10, the layout of the power devices 204 inside the enclosure 202 is optimized to enhance the effectiveness of the enclosure 202 as a heatsink by enabling the power devices 204 to engage the interior surfaces 212 of the enclosure 202 to form a conductive heat path between the power devices 204, the interior surfaces 212, and the exterior surfaces 216 that conductively transfers heat from the power devices 204 to the exterior surfaces 216. In some examples, the conductive heat path between the power devices 204 and the enclosure 202 has a combined cross-sectional area taken transverse to the direction of heat flow that is at least half the total surface area of the interior surfaces 212 of the enclosure 202 such that most of the generated heat losses flow through the fins 214 of the enclosure 202.

The layout of the power devices 204 inside the enclosure 202 includes a first row of power devices 204 that engage the interior surface 212 of the first portion 206 of the enclosure 202 and a second row of power devices 204 that engage the interior surface 212 of the second portion 208 of the enclosure 202. The first and second rows of power devices 204 are substantially parallel to the length of the enclosure 202 along the axis L-L and are substantially orthogonal to the width of the enclosure 202 along the axis W-W. In some examples, the first and second rows of power devices 204 are mirror images of one another.

In the example illustrated in FIGS. 5-10, the first and second rows of power devices each include three power devices 204. Alternative configurations are contemplated in which the first and second rows of power devices 204 include fewer than three power devices 204 such as one or two power devices 204, and in which the first and second rows of power devices 204 include more than three power devices 204 such as four, five, six power devices etc.

The power devices 204 in the first and second rows are aligned with one another inside the internal cavity 210 of the enclosure 202, and each face the printed circuit board 220 such that the printed circuit board 220 is sandwiched between the power devices 204. For example, a first power device 204 in a first row of power devices engaging the first portion 206 of the enclosure 202 is aligned with a first power device 204 in a second row of power devices engaging the second portion 208 of the enclosure 202. Similarly, a second power device 204 in the first row of power devices engaging the first portion 206 of the enclosure 202 is aligned with a second power device 204 in the second row of power devices engaging the second portion 208 of the enclosure 202. Additionally, a third power device 204 in the first row of power devices engaging the first portion 206 of the enclosure 202 is aligned with a third power device 204 in the second row of power devices engaging the second portion 208 of the enclosure 202. As described above, the rows of power devices may include fewer than three power devices or more than three power devices such that the number of aligned power devices 204 may vary depending on the number of power devices 204 contained inside the internal cavity 210 of the enclosure 202.

A thermal interface material mounts the power devices 204 onto the interior surfaces 212 of the first and second portions 206, 208 of the enclosure 202. Advantageously, the thermal interface material maximizes the conductive thermal flow between the power devices 204 and the enclosure 202 by eliminating air pockets between the power devices 204 and the interior surfaces 212 of the enclosure 202 to provide uniform conductive thermal flow.

The thermal interface material has a first surface area in contact with the interior surfaces 212 of the enclosure 202 and a second surface area in contact with the power devices 204. In some examples, the first and second surface areas are each equal to at least half the total surface area of the interior surfaces 212 inside the enclosure 202.

In some examples, the thermal interface material is a thermally conductive paste. For example, the thermally conductive paste can be a thermal non-silicone compound having a usable temperature range between about −40° F.~392° F. (−40° C.~200° C.) and a thermal conductivity of about 0.69 W/m-K.

In some further examples, the thermal interface material is a thermally conductive pad (e.g., a "gap-pad") that includes an adhesive on one or both sides. In some examples, the thermally conductive pad is a non-silicone, boron nitride filled sheet of material.

In some examples, one or more mechanical fasteners are used to mount the power devices 204 onto the interior surfaces 212 of the enclosure 202 and/or onto the printed circuit board 220. For example, the power devices 204 can include through-holes 226 that are configured to receive mechanical fasteners including screws, rivets, and the like.

Figure 11:
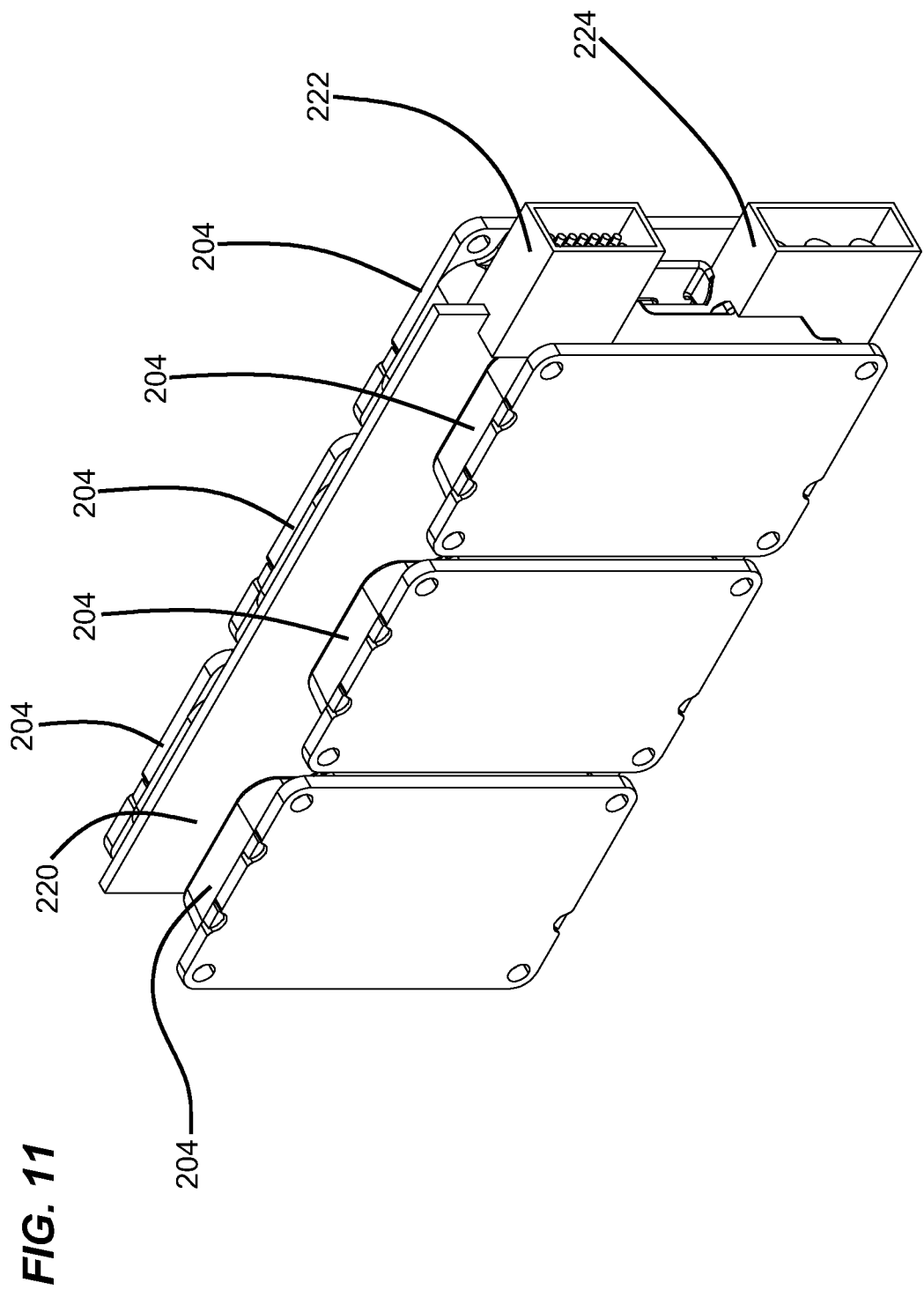
FIG. 11 is an isometric view of the power converter system of FIG. 2 with the enclosure removed therefrom.
Figure 12:
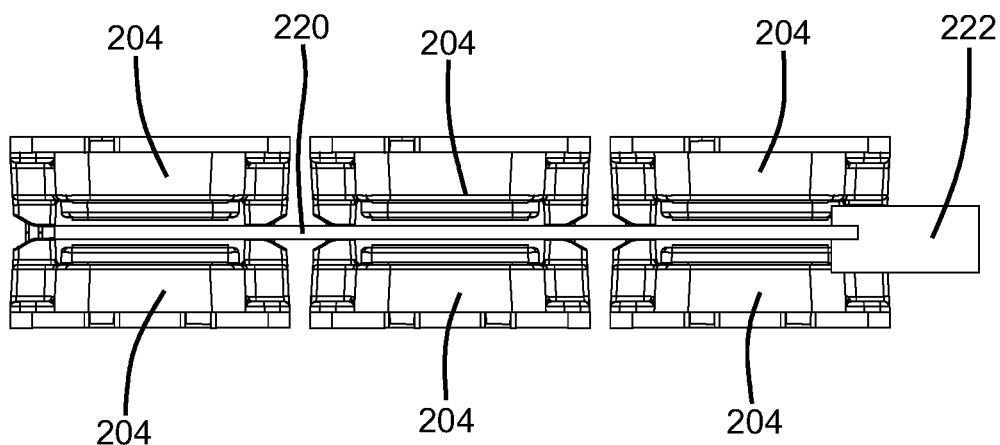
FIG. 12 is a top view of the power converter system of FIG. 2 with the enclosure removed therefrom.
Figure 13:
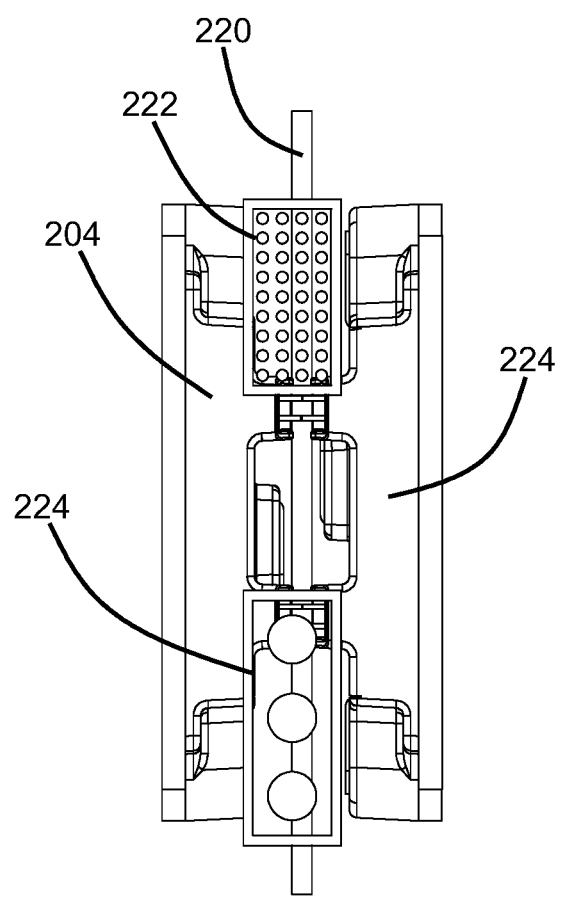
FIG. 13 is a side view of the power converter system of FIG. 2 with the enclosure removed therefrom.

FIGS. 11-13 are respective isometric, top, and side views of the power converter system 200 with the enclosure 202 removed therefrom. Referring now to FIGS. 11-13, the power devices 204 are first mounted onto the printed circuit board 220, and are thereafter mounted onto the interior surfaces 212 of the enclosure 202 via the thermal interface material. The power devices 204 are mounted onto the printed circuit board 220 by soldering. Alternatively, or in addition to soldering, the power devices 204 can be mounted onto the printed circuit board 220 by one or more mechanical fasteners such as a mounting screw, rivet, and the like. In some examples, the printed circuit board 220 is mounted to the enclosure 202 such that the printed circuit board 220 does not float inside the internal cavity 210.

The printed circuit board 220 includes a first connector 222 for receiving low voltage control signals from one or more electrical devices on the aircraft 10 such as from the power distribution units 106 or directly from the electrical loads 110. The printed circuit board 220 has a second connector 224 for high voltage power input and output such as for receiving the raw voltages from the one or more power generators 102 and transmitting transformed voltages to the power distribution units 106 for use by the electrical loads 110 on the aircraft 10.

Figure 15:
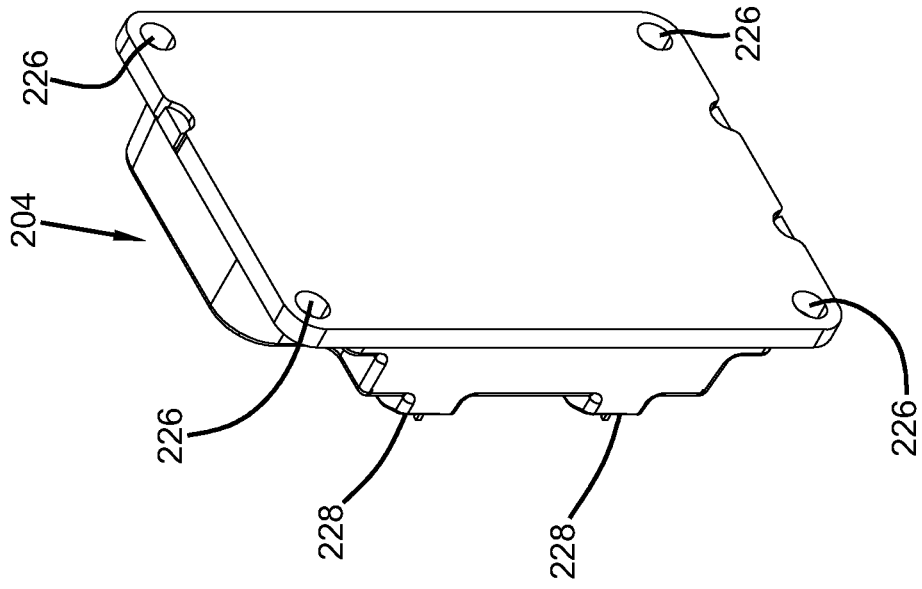
FIG. 15 is a rear isometric view of the power device of FIG. 13.
Figure 14:
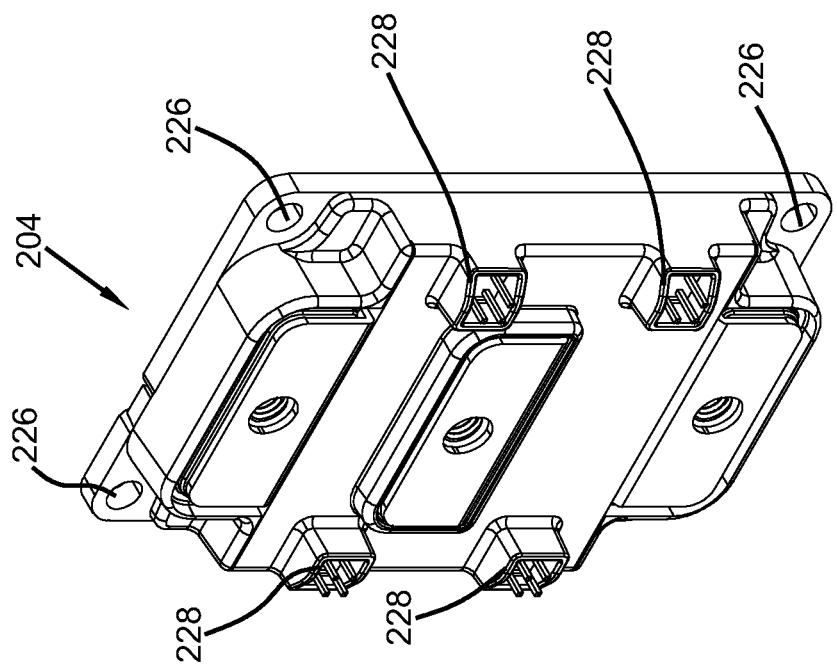
FIG. 14 is a front isometric view of an power device.

FIGS. 14 and 15 are front and rear isometric views of an example power device 204. Referring now to FIGS. 11-15, the power devices 204 include contacts 228 that are electrically connectable to the printed circuit board 220. As an illustrative example, the contacts 228 include copper links for current flow and conducting wire for gate charge control. High current flow is provided by the copper links or traces on the printed circuit board 220 with high copper deposition. For gate voltage control, current and power requirements are less and therefore conducting wires can be used. In some examples, contacts 228 are soldered onto the printed circuit board 220. As described above, the power device 204 include one or more through-holes 226 that are configured to receive mechanical fasteners for mechanically securing the power device 204 to the enclosure 202 and/or to the printed circuit board 220.

Control devices can be mounted onto the printed circuit board 220 for controlling the operation of the power devices 204. The control devices are signal processing units such as the ones in the power conversion assembly 300 described below with reference to FIGS. 16-20.

Figure 16:
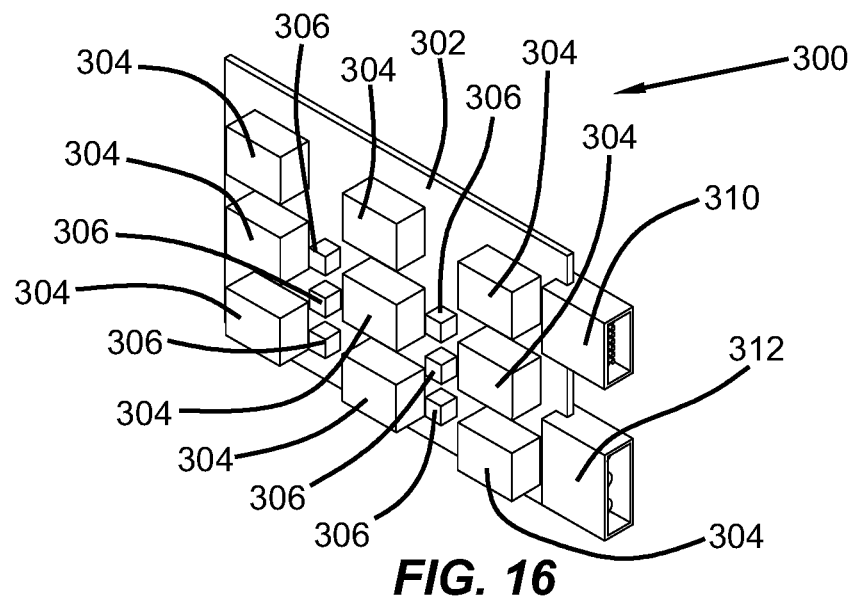
FIG. 16 is an isometric view of a power converter system in accordance with another embodiment of the present application.
Figure 17:
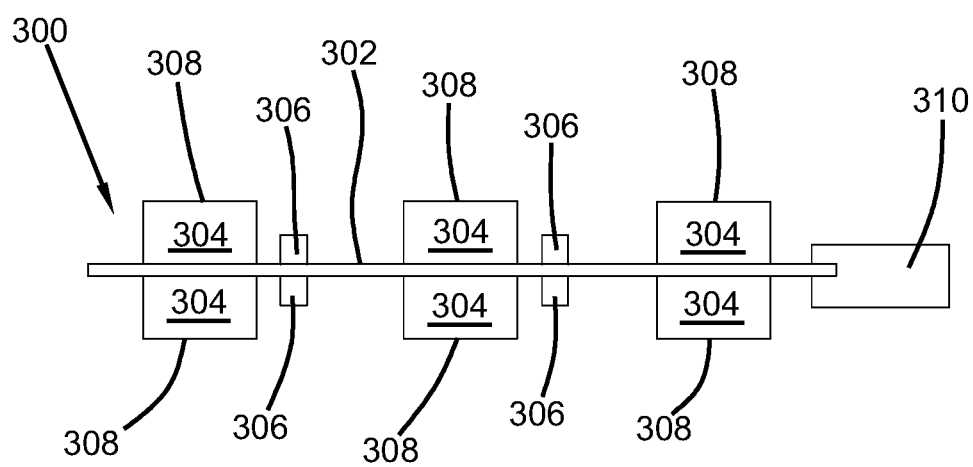
FIG. 17 is a top view of the power converter system of FIG. 16.
Figure 18:
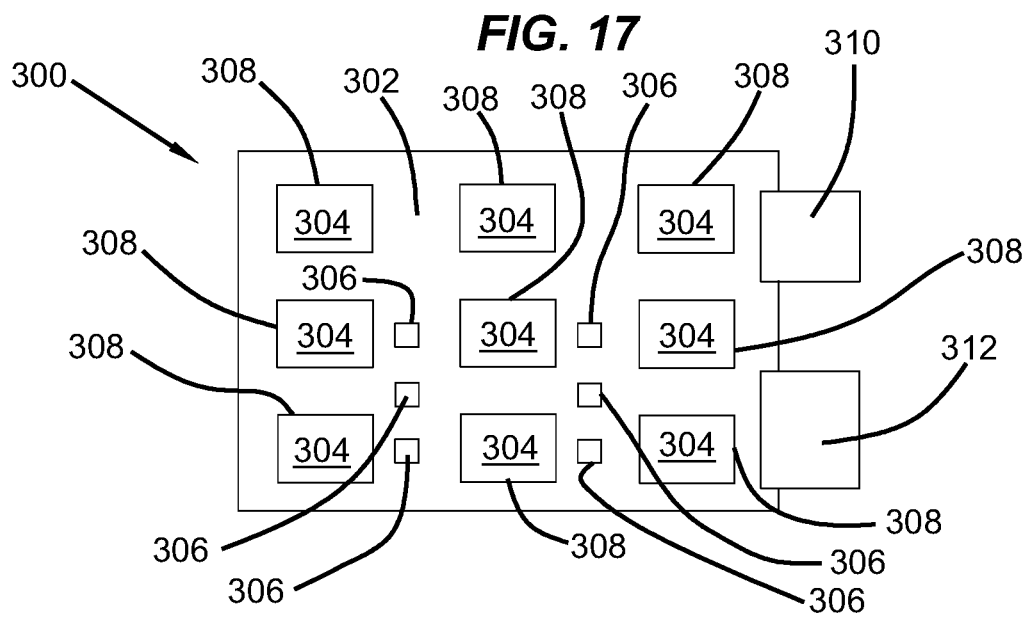
FIG. 18 is a side view of the power converter system of FIG. 16.

FIG. 16 is an isometric view of a power conversion assembly 300 in accordance with another embodiment of the present application. FIGS. 17-20 are top, side, front, and rear views, respectively, of the power conversion assembly 300. With reference now to FIGS. 16-20, the power conversion assembly 300 is an open frame unit that does not include an enclosure. In this example embodiment, the power conversion assembly 300 can be integrated into another component of the aircraft 10 such as a power distribution unit 106 of the aircraft 10. For example, the power conversion assembly 300 can slot into a power distribution unit 106. As a further example, the power conversion assembly 300 can be integrated as a back-plate in a power distribution unit 106. Advantageously, by eliminating the enclosure and by integrating the power conversion assembly 300 into another component of the aircraft 10, the weight and size of the power conversion assembly 300 is reduced even further.

The power conversion assembly 300 includes a layout of power devices 304 and control devices 306 mounted onto a printed circuit board 302. The power devices 304 are used by the power conversion assembly 300 to manage the voltages generated by the electrical system 100. The power devices 304 manage input voltages from the one or more power generators 102 and generate output voltages that are usable by one or more electrical loads 110 on the aircraft 10.

In contrast to the power devices 204 described above with reference to FIGS. 2-15, the power devices 304 are discrete devices such as a single electrical switch suitable for managing electrical power loads such as a solid-state switch. As an illustrative example, each power devices 304 is a single metal-oxide-semiconductor field-effect transistor (MOSFET), insulated-gate bipolar transistor (IGBT), and the like. Accordingly, the power devices 304 are smaller in size than the power devices 204, and have a lower current rating.

Each power device 304 includes a casing 308 that surrounds the power device 304 on the printed circuit board 302. The printed circuit board 302 and casings 308 help to remove heat losses from the power devices 304. In some examples, the printed circuit board 302 and casings 308 are naturally cooled through convection. In other examples, a fan can be mounted outside the power conversion assembly 300 to provide forced air cooling.

In some examples, the power devices 304 are mounted onto the printed circuit board 302 by soldering. In some further examples, the power devices 304 are mounted onto the printed circuit board 302 without using mechanical fasteners.

The control devices 306 are signal processing units that receive low voltage control signals to control the power devices 304. The control devices 306 are small integrated circuits that provide analog to digital conversion and digital to analog conversion. The control devices 306 provide digital signal processing and include devices such as programmable-gain amplifiers (GPA), digital signal processors (DSP), and the like.

The printed circuit board 302 is multilayered and has signal and power carrying traces. The printed circuit board 302 includes one or more connectors such as a first connector 310 for receiving the low voltage control signals. The printed circuit board 302 has a second connector 312 for high voltage power input and output such as for receiving the input voltages from the one or more power generators 102 and transmitting the output voltages to the power distribution units 106 for use by the electrical loads 110 on the aircraft 10.

The positioning of the power devices 304 on the printed circuit board 302 helps with heat dissipation. In some examples, the power conversion assembly 300 is configured to transfer heat to the power distribution unit 106. The power conversion assembly 300 includes a printed circuit board 302, and the power devices 304 mounted on the printed circuit board 302 such that thermal transmission paths are defined directly between the power devices 304 and the power distribution unit 106 when the power conversion assembly 300 is installed in the power distribution unit 106. In some examples, the heat sink is on the power distribution unit 106.

In the example of FIGS. 16-20, the layout of power devices 304 and control devices 306 includes three columns of power devices 304 and three rows of power devices 304 such that there are nine power devices 304 mounted onto the printed circuit board 302. A column of three control devices 306 is positioned between first and second columns of power devices 304, and another column of three control devices 306 is positioned between second and third columns of power devices 304 such that there are six control devices 306 mounted onto the printed circuit board 302. Alternative configurations for the layout of power devices 304 and control devices 306 on the printed circuit board 302 are possible such that the layout shown in FIGS. 16-20 is provided only as an illustrative example. Accordingly, the number and location of the power devices 304 and control devices 306 mounted onto the printed circuit board 302 may vary.

In some examples, the power devices 304 and control devices 306 are mounted on both sides of the printed circuit board 302. In other examples, the power devices 304 and control devices 306 are mounted on only one side of the printed circuit board 302.

Figure 22:
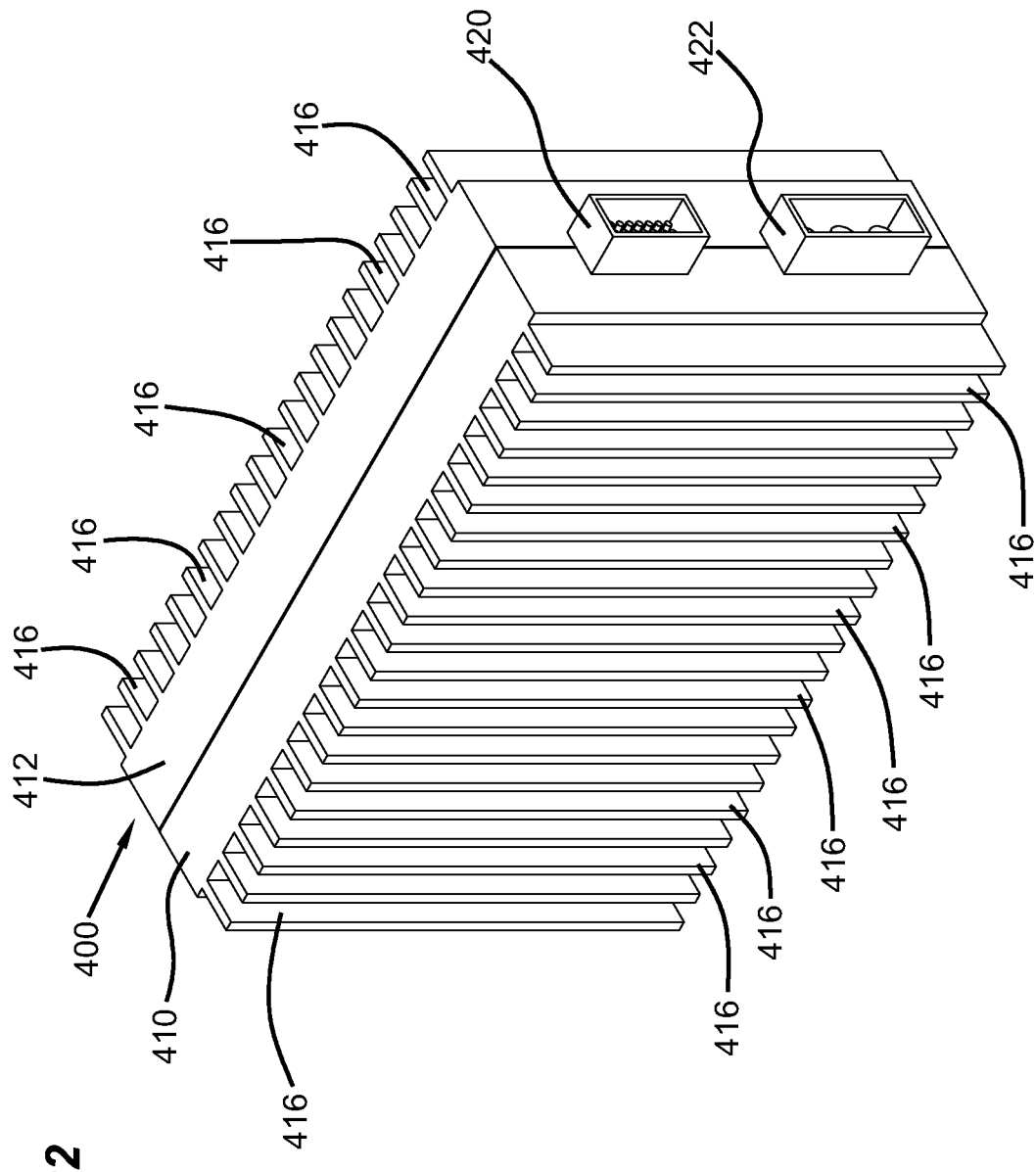
FIG. 22 is an isometric view of the power converter system of FIG. 21 showing the enclosure assembled together.

FIG. 21 is an isometric view of a power converter system 400 in accordance with another embodiment of the present application. In FIG. 21, the power converter system 400 is shown with an enclosure partially removed therefrom. FIG. 22 is an isometric view of the power converter system 400 with the enclosure assembled together. Referring now to FIGS. 21 and 22, the power converter system 400 includes a power conversion assembly that is substantially similar to the one described above with reference to FIGS. 16-20. The power conversion assembly includes power devices 404 and control devices 406 mounted onto a printed circuit board 402. The power devices 404 and control devices 406 including their layout on the printed circuit board 402 are also substantially similar to the power conversion assembly 300.

The printed circuit board 402 includes one or more connectors such as a first connector 420 for receiving low voltage control signals. The low voltage control signals can be used by the control devices 406 to control the operation of the power devices 404. The printed circuit board 402 has a second connector 422 for high voltage power input and output such as for receiving input voltages from the one or more power generators 102 and transmitting output voltages to the power distribution units 106 for use by the electrical loads 110 on the aircraft 10.

In the power converter system 400, an enclosure 408 is mounted around the power conversion assembly that includes the printed circuit board 402, power devices 404, and control devices 406 to provide additional heat transfer through thermal conduction. Accordingly, the power converter system 400 is a closed form version of the power conversion assembly 300 described above with reference to FIGS. 16-20. The power converter system 400 is a stand-alone system that can be mounted adjacent to the power distribution units 106. The enclosure 408 increases the heat transfer from the power devices 404 such that the power converter system 400 is used when the heat losses from the power devices 404 are larger.

As shown in FIGS. 21 and 22, the enclosure 408 includes first and second portions 410, 412 that each partially define an internal cavity 414 for housing the printed circuit board 402, power devices 404, and control devices 406. The first and second portions 410, 412 each have interior surfaces that thermally engage the power devices 404. The first and second portions 410, 412 when assembled together protect the power devices 404 from outside elements. The first and second portions 410, 412 each include exterior surfaces with fins 416 that increase the surface area of the exterior surfaces and enhance the cooling effectiveness of the enclosure 408.

A thermal interface material mounts the power devices 404 onto the interior surfaces of the first and second portions 410, 412 of the enclosure 408. Advantageously, the thermal interface material maximizes conductive thermal flow between the power devices 404 and the enclosure 408 by eliminating air pockets between the power devices 404 and the interior surfaces of the enclosure 408, and thereby provide uniform conductive thermal flow.

In some examples, the thermal interface material is a thermally conductive paste. For example, the thermally conductive paste can be a thermal non-silicone compound having a usable temperature range between about −40° F.~392° F. (−40° C.~200° C.) and a thermal conductivity of about 0.69 W/m-K.

In some further examples, the thermal interface material is a thermally conductive pad (e.g., a "gap-pad") that includes an adhesive on one or both sides. In some examples, the thermally conductive pad is a non-silicone, boron nitride filled sheet of material.

The various embodiments described above are provided by way of illustration only and should not be construed to limit the claims attached hereto. Those skilled in the art will readily recognize various modifications and changes that may be made without following the example embodiments and application illustrated and described herein, and without departing from the true spirit and scope of the following claims.

What is claimed is:

1. A power converter system comprising:
  a printed circuit board having
    a first connector for receiving low voltage control signals, and
    a second connector for receiving input voltages from one or more power generators and transmitting output voltages to a power distribution unit;
  a plurality of power devices being configured to manage the input voltages and generate the output voltages, the plurality of power devices mounted onto the printed circuit board, each of the plurality of power devices including:
    a base on a first side of each of the power devices,
    one or more through-holes through the base,
    a plurality of contact assemblies extending from a second side of each of the power devices toward the printed circuit board, the second side opposite the first side, the plurality of contact assemblies include:
      at least one contact to electrically connect each of the power devices to the printed circuit board, and
      at least one contact frame that surrounds the at least one contact;
  an enclosure mounted around the printed circuit board and the plurality of power devices, the enclosure having interior surfaces and exterior surfaces, the base of the power devices engaging the interior surfaces of the enclosure forming a conductive heat path between the power devices, the interior surfaces, and the exterior surfaces that conductively transfers heat from the power devices to the exterior surfaces, the conductive heat path between the power devices and the enclosure having a combined cross-sectional area taken transverse to a direction of heat flow that is at least half of a total surface area of the interior surfaces; and
  one or more mechanical fasteners disposed through the one or more through-holes of each of the power devices to mount the base of each of the power devices to the interior surfaces of the enclosure to secure each of the power devices to the enclosure.

2. The system of claim 1, wherein the enclosure includes first and second portions that assemble together and that each partially shape an internal cavity of the enclosure, and the exterior surfaces of the first and second portions include fins.

3. The system of claim 1, wherein the power devices each include a plurality of electrical switches suitable for managing electrical power loads.

4. The system of claim 3, wherein a first row of the power devices engage an interior surface of a first portion of the enclosure, and a second row of the power devices engage an interior surface of a second portion of the enclosure, the first and second rows of the power devices being substantially parallel to a length of the enclosure and substantially orthogonal to a width of the enclosure.

5. The system of claim 4, wherein the power devices in the first and second rows are aligned with one another inside an internal cavity of the enclosure.

6. The system of claim 5, further comprising:
a first power device in the first row of the power devices aligned with a first power device in the second row of the power devices;
a second power device in the first row of the power devices aligned with a second power device in the second row of the power devices; and
a third power device in the first row of the power devices aligned with a third power device in the second row of the power devices.

7. The system of claim 1, wherein the power devices engage the interior surfaces of the enclosure by a thermal interface material that eliminates air pockets between the power devices and the interior surfaces of the enclosure.

8. The system of claim 7, wherein the thermal interface material is a thermally conductive paste.

9. The system of claim 7, wherein the thermal interface material is a thermally conductive pad.

10. The system of claim 1, further comprising:
the one or more generators; and
the power distribution unit;
wherein the one or more power generators are configured to be located on a main engine of an aircraft, and the power distribution unit is configured to distribute electrical power generated from the one or more power generators to one or more electrical loads on the aircraft.

11. The system of claim 1, wherein each of the power devices include notched regions adjacent to the one or more through-holes, the notched regions causing open spaces between the power devices and the printed circuit board for at least a portion of the one or more mechanical fasteners.

12. The system of claim 11, wherein the notched regions cause each of the power devices to have a surface area facing the interior surfaces of the enclosure to be larger than a surface area of each of the power devices facing the printed circuit board.

* * * * *